(12) United States Patent
Okada

(10) Patent No.: US 11,088,228 B2
(45) Date of Patent: Aug. 10, 2021

(54) LIGHT-EMITTING DEVICE AND LIGHT-EMITTING SYSTEM

(71) Applicant: PIONEER CORPORATION, Tokyo (JP)

(72) Inventor: Takeru Okada, Kawasaki (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

(21) Appl. No.: 16/776,485

(22) Filed: Jan. 29, 2020

(65) Prior Publication Data

US 2020/0168679 A1    May 28, 2020

Related U.S. Application Data

(63) Continuation of application No. 16/081,895, filed as application No. PCT/JP2016/056673 on Mar. 3, 2016, now Pat. No. 10,580,842.

(51) Int. Cl.
*H01L 51/52* (2006.01)
*H01L 27/32* (2006.01)
*H01L 51/50* (2006.01)

(52) U.S. Cl.
CPC ...... *H01L 27/3246* (2013.01); *H01L 51/5012* (2013.01); *H01L 51/5206* (2013.01);
(Continued)

(58) Field of Classification Search
CPC .......... H01L 29/78606; H01L 27/1262; H01L 51/5203
See application file for complete search history.

(56) References Cited

U.S. PATENT DOCUMENTS 6,468,676 B1    10/2002   Ueda et al.
6,739,931 B2     5/2004   Yamazaki et al.
(Continued)

FOREIGN PATENT DOCUMENTS

DE    102014209628 A1    11/2015
JP       2000223280 A     8/2000
(Continued)

OTHER PUBLICATIONS

International Search Report for related PCT No. PCT/JP2016/056673 dated May 31, 2016, 2 pgs.
(Continued)

*Primary Examiner* — Thomas L Dickey
(74) *Attorney, Agent, or Firm* — Procopio, Cory, Hargreaves & Savitch LLP

(57) ABSTRACT

A first electrode (110) has optical transparency, and a second electrode (130) has light reflectivity. An organic layer (120) is located between the first electrode (110) and the second electrode (130). Light-transmitting regions (a second region (104) and a third region (106)) are located between a plurality of light-emitting units (140). An insulating film (150) defines the light-emitting units (140) and includes tapers (152, 154). A sealing member (170) covers the light-emitting units (140) and the insulating film (150). A low reflection film (190) is located on the side opposite to a substrate (100) with the second electrode (130) therebetween. The low reflection film (190) covers at least one portion of the tapers (152 and 154).

14 Claims, 16 Drawing Sheets

(52) U.S. Cl.
CPC ...... *H01L 51/5221* (2013.01); *H01L 51/5246* (2013.01); *H01L 51/5256* (2013.01); *H01L 51/5281* (2013.01)

(56) References Cited

U.S. PATENT DOCUMENTS

| | | |
|---|---|---|
| 6,809,473 B2 | 10/2004 | Ueda et al. |
| 6,995,511 B2 | 2/2006 | Yamazaki et al. |
| 7,459,849 B2 | 12/2008 | Yamazaki et al. |
| 7,514,868 B2 | 4/2009 | Yamazaki et al. |
| 7,876,037 B2 | 1/2011 | Koshihara et al. |
| 8,044,588 B2 | 10/2011 | Yamazaki et al. |
| 8,310,149 B2 | 11/2012 | Lifka et al. |
| 8,421,352 B2 | 4/2013 | Yamazaki et al. |
| 8,618,732 B2 | 12/2013 | Yamazaki et al. |
| 8,655,588 B2 | 2/2014 | Wong et al. |
| 8,963,414 B2 | 2/2015 | Sawabe et al. |
| 9,263,503 B2 | 2/2016 | Yamazaki et al. |
| 2002/0074936 A1 | 6/2002 | Yamazaki et al. |
| 2002/0127431 A1 | 9/2002 | Ueda et al. |
| 2004/0195964 A1 | 10/2004 | Yamazaki et al. |
| 2005/0174051 A1 | 8/2005 | Yamazaki et al. |
| 2006/0082300 A1 | 4/2006 | Yamazaki et al. |
| 2008/0211394 A1 | 9/2008 | Koshihara et al. |
| 2009/0243464 A1 | 10/2009 | Yamazaki et al. |
| 2010/0014712 A1 | 1/2010 | Sampedro Diaz et al. |
| 2011/0012117 A1* | 1/2011 | Yamazaki ............... H01L 29/45 257/59 |
| 2011/0133635 A1 | 6/2011 | Yamazaki et al. |
| 2011/0193477 A1 | 8/2011 | Lifka et al. |
| 2012/0267611 A1 | 2/2012 | Young |
| 2012/0303176 A1 | 11/2012 | Wong et al. |
| 2012/0303255 A1 | 11/2012 | Wong et al. |
| 2013/0182418 A1 | 7/2013 | Sawabe et al. |
| 2013/0285062 A1 | 10/2013 | Yamazaki et al. |
| 2014/0185129 A1 | 1/2014 | Wu et al. |

FOREIGN PATENT DOCUMENTS

| | | |
|---|---|---|
| JP | 20012300078 A | 8/2001 |
| JP | 2002164181 A | 6/2002 |
| JP | 2008218142 A | 9/2008 |
| JP | 2012506604 A | 3/2012 |
| JP | 2013149376 A | 1/2013 |
| JP | 2016001665 A | 1/2016 |
| WO | 2012161597 A2 | 11/2012 |

OTHER PUBLICATIONS

Office Action for related JP App. No. 2019185740 dated Oct. 27, 2020; 2 pages.
Supplementary Partial European Search Report for related EP App. No. AC2526 EP S5 dated Nov. 30, 2020.

\* cited by examiner

LIGHT-EMITTING DEVICE AND LIGHT-EMITTING SYSTEM

SPECIFICATION

This application is a continuation of application Ser. No. 16/081,895 filed Aug. 31, 2018, which is a National Stage Entry of International Application No. PCT/JP2016/056673 filed on Mar. 3, 2016, the disclosures of which are incorporated herein by reference in their entirety.

TECHNICAL FIELD

The present invention relates to a light-emitting device and a light-emitting system.

BACKGROUND ART

In recent years, there has been progress in the development of light-emitting devices using organic EL. Such light-emitting devices are used as illumination devices or display devices and configured of an organic layer interposed between a first electrode and a second electrode. Generally, a light-transmitting material is used for the first electrode, and a metal material is used for the second electrode.

One of the light-emitting devices which utilizes the organic EL is a technology described in Patent Document 1. In order to provide an organic EL element with optical transparency (or a "see-through" property), the technology in Patent Document 1 provides the second electrode only in a portion of a substrate. In such a configuration, since a region located between a plurality of second electrodes transmits light, the organic EL element is capable of having optical transparency.

Further, Patent Document 2 describes providing a mirror layer in a position overlapping an active region of the organic layer in the organic EL element in which a portion of the organic layer is an inactive region and additionally, the second electrode is provided with optical transparency.

RELATED ART DOCUMENT

Patent Document

[Patent Document 1]: Japanese Unexamined Patent Application Publication No. 2013-149376
[Patent Document 2]: Japanese Unexamined Patent Application Publication (Translation of PCT Application) No. 2012-506604

SUMMARY OF THE INVENTION

In a light-emitting device having optical transparency, there is a case where light emitted by a light-emitting unit is desired to be emitted only from a surface (a surface on a light-emitting side). Meanwhile, the light-emitting device utilizing organic EL includes a sealing member in order to protect the organic layer from moisture or oxygen. Meanwhile, a portion of the light emitted from the organic layer toward the surface is reflected on an interface of a layer or a substrate and heads to the sealing member. A portion of this reflected light has an angle larger than a critical angle on a surface of the sealing member, thereby further reflected on the surface of the sealing member and heads to a second electrode. Here, when there is an inclined portion in the second electrode, an angle of the reflected light decreases at this inclined portion, and as a result, an amount of light which is transmitted through the sealing member, that is, the amount of light emitted to a rear surface side, increases.

An example of the problem to be solved by the present invention is to reduce an amount of light emitted to a rear surface side in a light-emitting device having optical transparency.

Means for Solving the Problem

The invention described in claim 1 is a light-emitting device including:
a light-transmitting partition member;
a plurality of light-emitting units formed on the substrate, each light-emitting unit including a light-transmitting first electrode, a light-reflective second electrode, and an organic layer located between the first electrode and the second electrode;
a light-transmitting region located between the plurality of light-emitting units;
an insulating film that defines the light-emitting unit and includes a taper;
a sealing member which covers the light-emitting unit and the insulating film;
a low reflection film located on the opposite side of the organic layer substrate with the second electrode put therebetween,
in which the second electrode covers at least one portion of the taper, and
in which the low reflection film overlaps the at least one portion of the taper.

The invention described in claim 12 is a light-emitting system including:
a light-transmitting partition member that partitions a space from an exterior;
a light-transmitting substrate disposed on the partition member;
a plurality of light-emitting units formed on the substrate, each light-emitting unit having a light-transmitting first electrode, a light-reflective second electrode, and an organic layer located between the first electrode the second electrode;
a light-transmitting region located between the plurality of light-emitting units;
an insulating film that defines the light-emitting unit and includes a taper;
a sealing member that covers the light-emitting unit and the insulating film;
a low reflection film located on the opposite side of the substrate with the second electrode therebetween,
in which the second electrode covers at least one portion of the taper, and
in which the low reflection film overlaps the at least one portion of the taper.

BRIEF DESCRIPTION OF THE DRAWINGS

The objects described above, and other objects, features and advantages are further made apparent by a suitable embodiment that will be described below and the following accompanying drawings.

DESCRIPTION OF EMBODIMENTS

Figure 1:
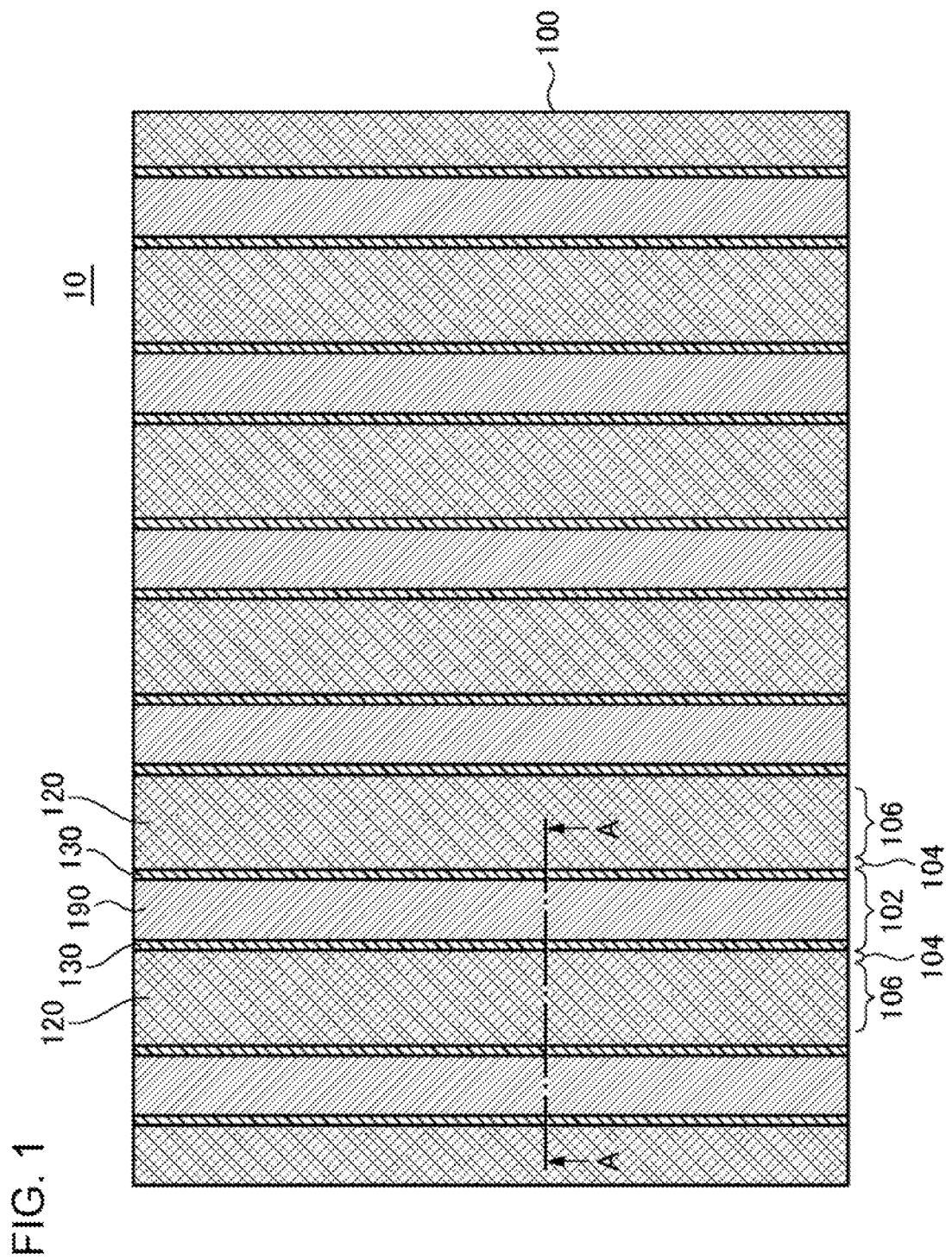
FIG. 1 is a plan view of a light-emitting device according to an embodiment.

An embodiment of the present invention will be described below by referring to the drawings. Moreover, in all the drawings, the same constituent elements are given the same reference numerals, and descriptions thereof will not be repeated.

Embodiment

Figure 2:
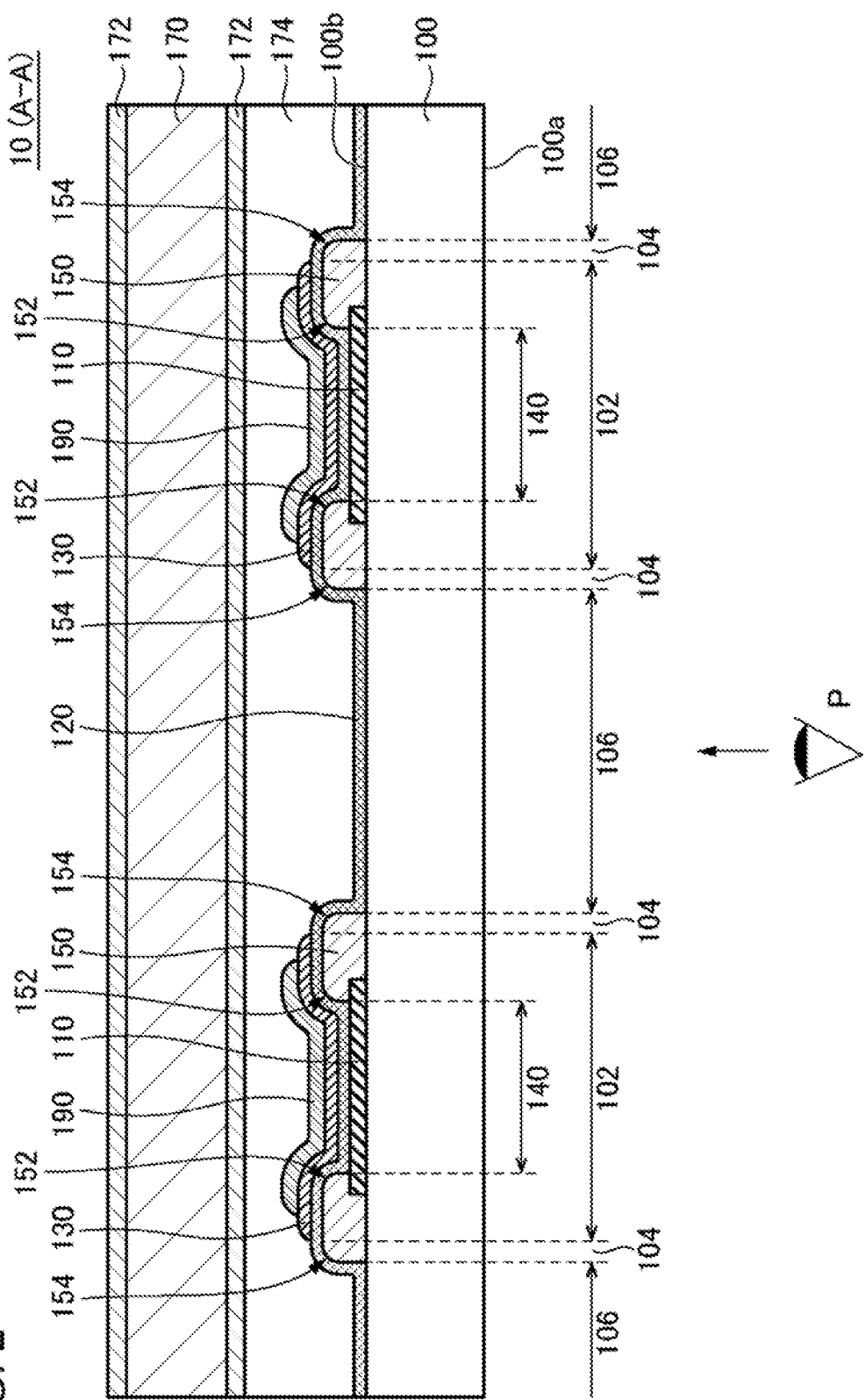
FIG. 2 is a cross-sectional view taken along line A-A of FIG. 1.

FIG. 1 is a plan view of a configuration of a light-emitting device 10 according to an embodiment. FIG. 2 is a cross-sectional view taken along line A-A of FIG. 1. The light-emitting device 10 according to the embodiment includes a substrate 100, a plurality of light-emitting units 140, a light-transmitting region (a second region 104 and a third region 106), an insulating film 150, a sealing member 170, and a low reflection film 190. Each of the plurality of light-emitting units 140 includes a first electrode 110, an organic layer 120, and a second electrode 130. The first electrode 110 is light-transmitting, and the second electrode 130 has light reflectivity. Further, the organic layer 120 is located between the first electrode 110 and the second electrode 130. The light-transmitting region (the second region 104 and the third region 106) is located between the plurality of light-emitting units 140. The insulating film 150 defines the light-emitting units 140 and includes tapers 152 and 154. The sealing member 170 covers the light-emitting units 140 and the insulating film 150. The low reflection film 190 is located on the opposite side of the substrate 100 with the second electrode 130 located therebetween. The second electrode 130 covers at least a portion of the tapers 152 and 154. Therefore, a portion of a surface of the second electrode 130 on the side opposite the substrate 100 is inclined. In addition, the low reflection film 190 covers at least the portion of the tapers 152 and 154. In other words, the low reflection film 190 covers the portion which inclines in the second electrode 130. A detailed description on the light-emitting device 10 will be provided below.

The substrate 100 is a substrate, such as, for example, a glass substrate or a resin substrate which has optical transparency. The substrate 100 may have flexibility. In a case where the substrate has flexibility, the thickness of the substrate 100 is, for example, equal to or greater than 10 μm and equal to or less than 1,000 μm. The substrate 100 is polygonal, for example, rectangular, or round. In a case where the substrate 100 is a resin substrate, the substrate 100 is formed using, for example, polyethylene naphthalate (PEN), polyether sulphone (PES), polyethylene terephthalate (PET), or polyimide. In addition, in a case where the substrate 100 is a resin substrate, an inorganic barrier film of $SiN_x$, SiON or the like is formed on at least one surface (preferably, both surfaces) of the substrate 100 in order to prevent moisture from permeating the substrate 100. This inorganic barrier film is formed, for example, by sputtering, CVD, or ALD. Meanwhile, in a case where the substrate 100 is a resin substrate, methods of forming the light-emitting device 10 include directly depositing the first electrode 110 and the organic layer 120 on the resin substrate, to be described later, forming the first electrode 110 and layers that follow directly on a glass substrate, peeling the first electrode 110 from the glass substrate, and thereafter, placing the peeled laminate on a resin substrate.

The light-emitting unit 140 is formed on a second surface 100b of the substrate 100. The light-emitting unit 140 has a configuration in which the first electrode 110, the organic layer 120 including a light-emitting layer, and the second electrode 130 are laminated in this order. In addition, a first surface 100a of the substrate 100 is a surface from which light is emitted.

The first electrode 110 is a transparent electrode which has optical transparency. A material of the transparent electrode is a material containing a metal, for example, a metal oxide such as an indium tin oxide (ITO), an indium zinc oxide (IZO), an indium tungsten zinc oxide (IWZO), a zinc oxide (ZrO), or the like. The thickness of the first electrode 110 is, for example, equal to or greater than 10 nm and equal to or less than 500 nm. The first electrode is formed by, for example, sputtering or vapor deposition. Moreover, the first electrode 110 may be a conductive organic material such as carbon nanotubes or PEDOT/PSS. Further, the first electrode 110 may have a laminated structure in which a plurality of layers are laminated. In the diagram, a plurality of rectangular shaped (stripe patterned) first electrodes 110 are formed in parallel to each other on the substrate 100. Thus, the first electrode 110 is not located in the later described second region 104 and the third region 106.

The organic layer 120 has a structure composed of, for example, a hole injection layer, a light emitting layer, and an electron injection layer, laminated in this order. The hole transporting layer may be formed between the hole injection layer and the light emitting layer. Moreover, an electron transporting layer may be formed between the light emitting layer and the electron injection layer. The organic layer 120 may be formed by vapor deposition. Also, at least one layer in the organic layer 120, for example, a layer in contact with the first electrode 110, may be formed by coating, such as ink jetting, printing, or spraying. In this case, the rest of the layers in the organic layer 120 are formed by vapor deposition. Moreover, all layers of the organic layer 120 may be formed by coating. Meanwhile, instead of the organic layer 120, another light-emitting layer (for example, an inorganic light-emitting layer) may be included. Further, a luminescent color radiated by the light-emitting layer (or a color of light emitted from the organic layer 120) may be different from the luminescent color (or the color of the light emitted from the organic layer 120) of the light-emitting layer of an adjacent light-emitting unit 140.

The second electrode 130 has light reflectivity and includes a metal layer composed of a metal selected from a first group including, for example, Al, Au, Ag, Pt, Mg, Sn, Zn, and In, or an alloy of metals selected from the first group. The thickness of the second electrode 130 is, for example, equal to or greater than 10 nm and equal to or less than 500 nm. However, the second electrode 130 may be formed using a material exemplified as the material of the first electrode 110. The second electrode 130 is formed by, for example, sputtering or vapor deposition. In the example shown in the drawing, the light-emitting device 10 includes a plurality of linear second electrodes 130. The second electrode 130 is provided per each of the first electrodes 110, and a width thereof is wider than that of the first electrode 110. Therefore, in a case where viewed from a direction perpendicular to the substrate 100, in a width direction, the entirety of the first electrode 110 is overlapped and covered by the second electrode 130. By adopting such configuration, an extraction direction of the light emitted by the light-emitting layer of the organic layer 120 may be adjusted. Specifically, emission of the light to the opposite side of the first surface 100a of the light-emitting device 10 may be inhibited.

The edge of the first electrode 110 is covered by an insulating film 150. The insulating film 150 is formed of, for example, a photosensitive resin material such as polyimide and surrounds a portion of the first electrode 110 serving as the light emitting unit 140. A surface of the insulating film 150 includes the taper 152 (a first taper) and the taper 154 (a second taper). The taper 152 faces the light-emitting unit 140 and the taper 154 faces a light transmitting region (the second region 104 and the third region 106).

The second electrode 130 covers at least the taper 152. A portion of the surface of the second electrode 130 on the side opposite from the substrate 100 includes a taper. Further, an edge of the second electrode 130 in the width direction is located above the insulating film 150, however, at least a half of the taper 154 is left uncovered by the second electrode 130. However, a location of the edge of the second electrode 130 is not limited to an example shown in the drawing. In addition, in the example shown in the drawing, the organic layer 120 is also formed on top and side of the insulating film 150. The organic layer 120 is preferably electrically separated between the light-emitting units 140 next to each other but may be formed continuously with the light-emitting units 140 text to each other.

The light-emitting device 10 further includes the low reflection film 190. The low reflection film 190 is located on the opposite side of the substrate 100 (the upper side in FIG. 2) with the second electrode 130 disposed therebetween. In the example shown in FIG. 2, the low reflection film 190 is formed on the second electrode 130 (on the surface of the second electrode on the sealing member 170 side). In other words, the low reflection film 190 touches the surface of the second electrode 130 on the side opposite the substrate 100.

The low reflection film 190 is formed using a material having low reflectance, for example, a material whose reflectance of light is lower than that of the second electrode 130. Examples of such material includes materials containing Cr, Ni, Mo, carbon black, or titan black. The low reflection film 190 may be a single layer film or may be a laminated film in which plural layers are laminated. In the latter case, at least one film may be formed using a material different from that of another film. Such a laminated film includes, for example, a laminated film of a chromium oxide film and a chromium film. Further, the low reflection film 190 may be formed using an organic material containing a black pigment. The thickness of the low reflection film 190 is determined so that, for example, the visible light reflectance of visible light of the low reflection film 190 is equal to or less than 50%.

The low reflection film 190 covers at least the taper 152. In other words, when viewed in a direction perpendicular to the substrate 100, the low reflection film 190 overlaps the taper 152. Meanwhile, the low reflection film 190 preferably covers the taper 152 and a region located around the taper 152. In the example shown in FIG. 2, the width of the light-emitting unit 140 is defined by two insulating films 150. Further, each of the two insulating films 150 includes the taper 152 and the taper 154. The low reflection film 190 covers the light-emitting unit 140 and the two tapers 152.

As described above, in the example shown in FIG. 2, an edge portion of the second electrode 130 is located above the insulating film 150. Further, in the width direction of the light-emitting unit 140, an edge of the low reflection film 190 is located above the second electrode 130. In other words, in the width direction of the light-emitting unit 140, the edge portion of the second electrode 130 is exposed from the low reflection film 190.

The low reflection film 190 is formed by, for example, sputtering using a mask, vapor deposition using a mask, or screen printing. In a case where the low reflection film 190 and the second electrode 130 are formed using the same manufacturing method (for example, vacuum deposition), the second electrode 130 and the low reflection film 190 may be formed continuously. For example, the second electrode 130 and the low reflection film 190 may be formed using the same mask in the same processing vessel. In addition, the processing vessel to form the second electrode 130 and the processing vessel to form the low reflection film 190 may be connected to each other through a conveyance path in a vacuum state.

When viewed in a direction perpendicular to the substrate 100, the plurality of light-emitting units 140 extend in parallel to one another. In the example shown in FIG. 1, all of the plurality of light-emitting units 140 extend in rectangular shapes (in a striped pattern). However, the light-emitting units 140 may bend in the middle.

When viewed in a direction perpendicular to the substrate 100, the substrate 100 includes the first region 102, the second region 104 and the third region 106. The first region 102 overlaps the second electrode 130. When the second electrode 130 has light shielding properties, the first region 102 does not transmit light either from a front surface to a rear surface or from the rear surface to the front surface of the light-emitting device 10 or the substrate 100. The second region 104 does not overlap the second electrode 130 but overlaps the insulating film 150. The third region 106 neither overlaps the second electrode 130 nor the insulating film 150. In addition, since the width of the second region 104 is narrower than that of the third region 106, the light-emitting device 30 includes sufficient optical transparency.

In the example shown in the drawing, the organic layer 120 is also formed in the second region 104 and the third region 106. In other words, the organic layer 120 of the plurality of the light-emitting units 140 are formed continuously. However, the organic layer 120 is not required to be formed in the third region 106. In addition, the organic layer 120 is not required to be formed in the second region 104.

The width of the second region 104 is narrower than that of the third region 106. Further, the width of the third region 106 may be wider or narrower than that of the first region 102. In a case where the width of the first region 102 is 1, the width of the second region 104 is, for example, equal to or greater than 0 (or more than 0 or equal to or greater than 0.1) and equal to or less than 0.2, and the width of the third region 106 is, for example, equal to or greater than 0.3 and equal to or less than 2. Further, the width of the first region 102 is, for example, equal to or greater than 50 μm and equal to or less than 500 μm, the width of the second region 104 is, for example, equal to or greater than 0 μm (or more than 0 μm) and equal to or less than 100 μm, and the width of the third region 106 is, for example, equal to or greater than 15 μm and equal to or less than 1,000 μm.

The light-emitting device 10 includes the sealing member 170. The sealing member 170 is, for example, a plate like member formed of resin, and includes a barrier film 172 (for example, an inorganic film) on at least one surface (preferably both surfaces) thereof. In this case, the resin which configures the sealing member 170 is, for example, polyethylene naphthalate (PEN), polyether sulphone (PES), polyethylene terephthalate (PET), or polyimide. Further, the barrier film 172 is, for example, $SiN_x$ or SiON, and formed by, for example, sputtering, CVD, or ALD. The sealing member 170 is fixed to the second surface 100b of the substrate 100, by using, for example, an insulating layer 174 (for example an adhesive layer or a pressure-sensitive adhesive layer). Meanwhile, at least a portion of the insulating layer 174 may be in contact with the second electrode 130.

Next, the manufacturing method of the light-emitting device 10 is described. First, the first electrode 110 is formed on the second surface 100b of the substrate 100. Next, the insulating film 150 is formed, and then, the organic layer 120, the second electrode 130 and the low reflection film 190 are further formed in this order. Thereafter, by using the insulating layer 174, the sealing member 170 is fixed to the second surface 100b of the substrate 100.

Since the second electrode 130 has light reflectivity, the light emitted by the light-emitting unit 140 is emitted to the outside of the light-emitting unit 140 through the first electrode 110. Here, between the first electrode 110 and the first surface 100a of the substrate 100, there are a plurality of interfaces (for example, the interface between the first electrode 110 and the substrate 100, and the interface between the substrate 100 and the outside). Therefore, a portion of the light from the light-emitting unit 140 is reflected since the angle thereof is greater than the critical angle of these interfaces. In a case where all of the interfaces are substantially parallel, the angle of the reflected light does not change. However, as shown in the present embodiment, in a case where a portion of the insulating film 150 serves as the taper 152, a portion overlapping the taper 152 in the second electrode 130 includes a taper. When reflective light is incident on the portion of the second electrode 130 having the taper, the angle of the reflected light becomes small when the reflected light is further reflected on the taper. Therefore, there is a possibility that the aforementioned reflected light is emitted to the rear surface side (the upper side in FIG. 2) of the light-emitting device 10.

In contrast, in the present embodiment, the low reflection film 190 is located on a side opposite from the substrate 100 with the second electrode 130 disposed therebetween and overlaps the taper 152 of the insulating film 150. Therefore, it is possible to inhibit reflective light from being incident on the taper of the second electrode 130, and as a result, it is possible to inhibit light emitted by the light-emitting unit 140 from being emitted to the rear side of the light-emitting device 10 by the aforementioned mechanism. In particular, in the example shown in FIG. 2, the low reflection film 190 is in contact with the surface of the second electrode 130 on the side opposite from the substrate 100. Therefore, it is possible to sufficiently inhibit reflective light from being incident on the taper of the second electrode 130. Thus, a possibility of the reflected light leaking to the rear surface side (the upper side in FIG. 2) of the light-emitting device 10 can be reduced.

In addition, since it is possible to inhibit incident light from the rear surface side of the light-emitting device 10 from being reflected on the second electrode 130, compared to a case where the low reflection film 190 is not provided, it is possible to make a person recognize an increase in the light-transmittance of the light-emitting device 10. In addition, when the low reflection film 190 covers the light-emitting unit 140, even in a case where a pinhole is formed in the second electrode 130, it is possible to block the pinhole with the low reflection film 190. Therefore, it is possible to inhibit moisture or the like from infiltrating the organic layer 120 from the second electrode 130 side.

MODIFICATION EXAMPLE 1

Figure 3:
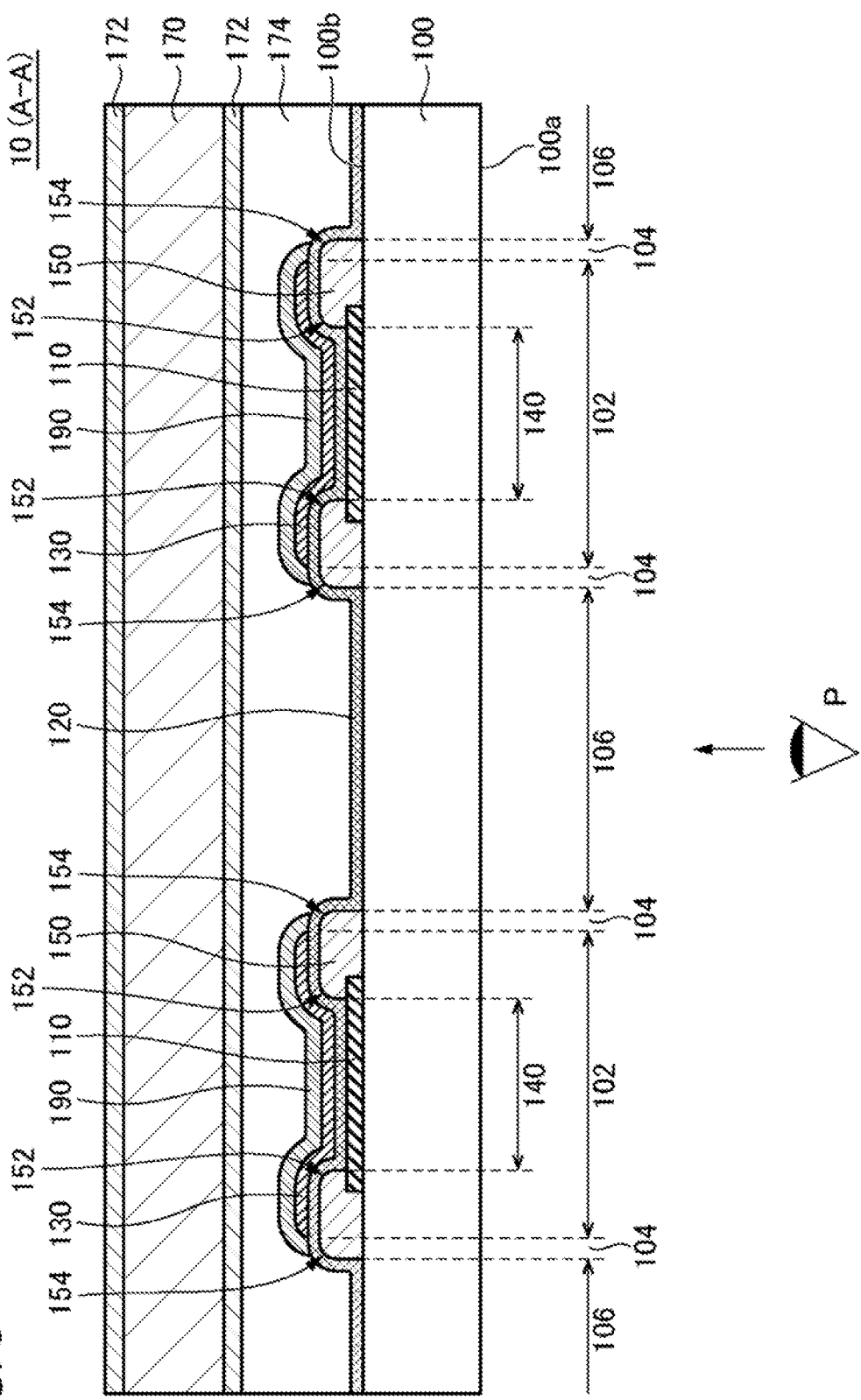
FIG. 3 is a cross-sectional view of a configuration of a light-emitting device according to Modification Example 1.

FIG. 3 is a cross-sectional view of a configuration of a light-emitting device 10 according to Modification Example 1 and corresponds to FIG. 2 of the embodiment. The light-emitting device 10 according to the present modification example has the same configuration as that of the light-emitting device 10 according to the embodiment, except that the low reflection film 190 covers both of the taper 252 (a first taper) and the taper 154 (a second taper) of the insulating film 150.

In detail, an end of the low reflection film 190 is further separated from the light-emitting unit 140 than an end of the second electrode 130. In other words, the low reflection film 190 covers the entire second electrode 130 in the width direction of the light-emitting unit 140. In the example shown in the drawing, the end of the low reflection film 190 is located above a aide face of the insulating film 150 on the third region 106 side. However, at least one of the ends of the low reflection film 190 may be located in the third region 106.

In the present modification example also, the same as the embodiment, a possibility of light leakage to a rear surface side of the light-emitting device 10 can be reduced. Further, the low reflection film 190 also covers the taper 154 of the insulating film 150. Therefore, it is possible to sufficiently inhibit reflected light from being incident on a taper of the second electrode 130. Thus, the possibility of the reflected light leaking to a rear surface side of the light-emitting device 10 can be reduced.

Modification Example 2

Figure 4:
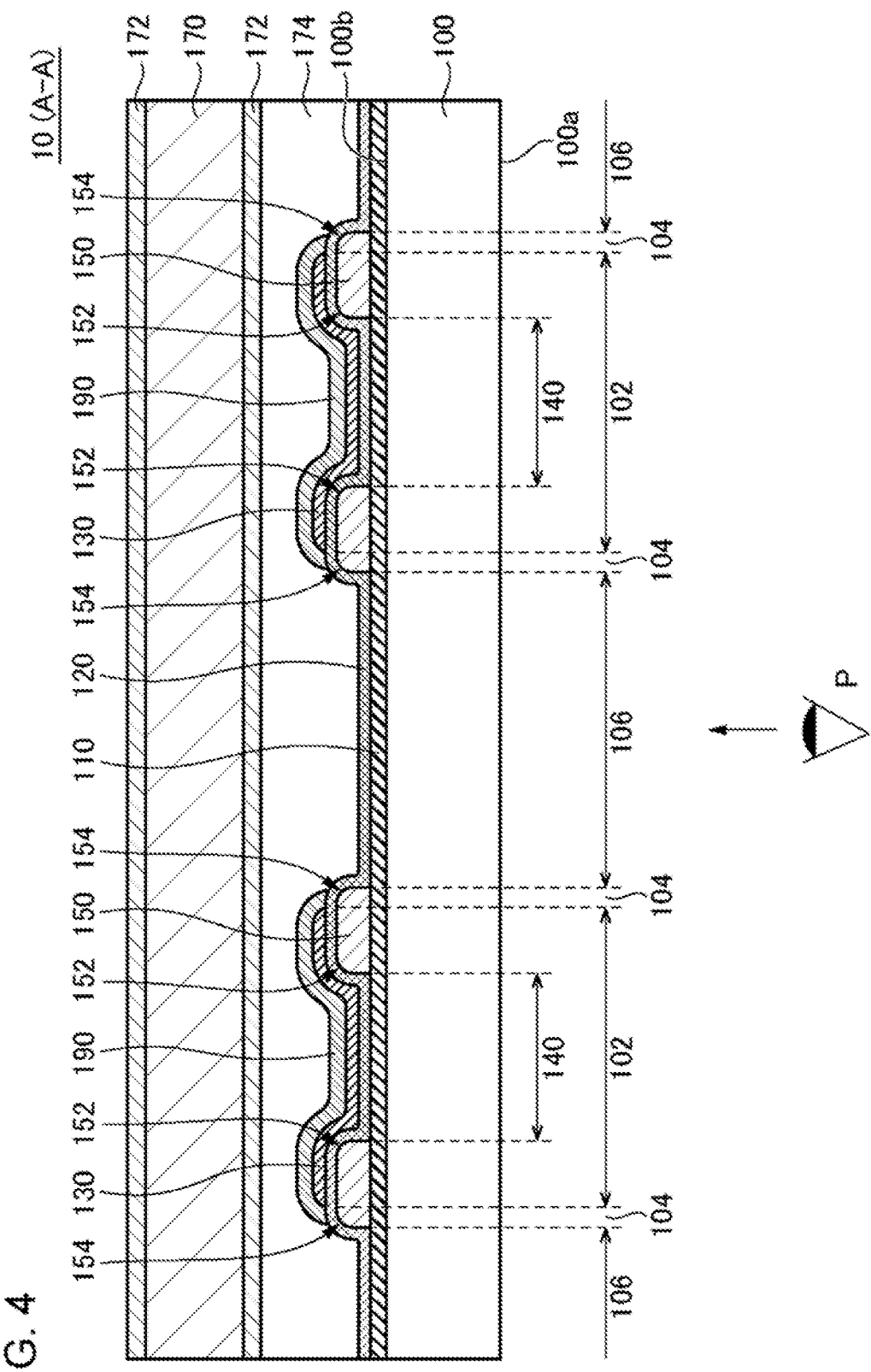
FIG. 4 is a cross-sectional view of a configuration of a light-emitting device according to Modification Example 2.

FIG. 4 is a cross-sectional view of a configuration of a light-emitting device 10 according to Modification Example 2 and corresponds to FIG. 2 of the embodiment. The light-emitting device 10 according to the present modification example has the same configuration as that of the light-emitting device 10 according to the Modification Example 1 except that the first electrode 130 is formed in all of the first region 102, the second region 104, and the third region 106. In other words, the first electrodes 110 of the respective ones of the plurality of the light-emitting units 140 are connected to each other.

In the present modification example also, the same as Modification Example 1, a possibility of light leakage to a rear surface side of the light-emitting device 10 can be reduced. Meanwhile, in the light-emitting device 10 according to the embodiment, the first electrode 110 may have the same configuration as that of the present modification example. In this case, the same as the present modification example, the possibility of the reflected light leaking to the rear surface side of the light-emitting device 10 can be further reduced.

MODIFICATION EXAMPLE 3

Figure 5:
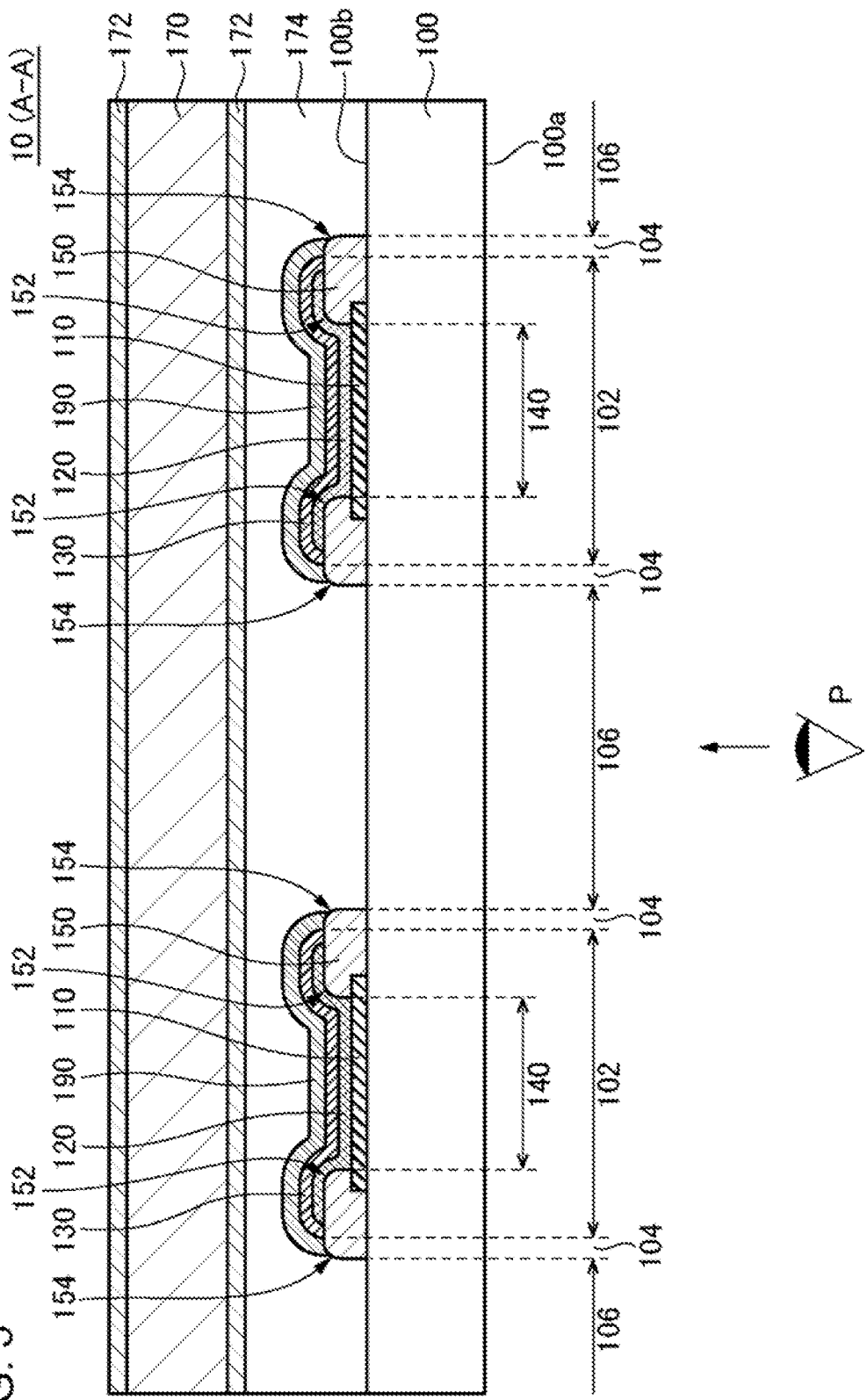
FIG. 5 is a cross-sectional view of a configuration of a light-emitting device according to Modification Example 3.

FIG. 5 is a cross-sectional view of a configuration of a light-emitting device 10 according to Modification Example 3 and corresponds to FIG. 2 of the embodiment. The light-emitting device 10 according to the present example has the same configuration as that of the light-emitting device 10 according to Modification Example 1, except that the organic layer 120 is divided between light-emitting units 140 next to each other. The organic layer 120 is not formed in, for example, a portion of, or the entire portion of the third region 106. The organic layer 120 is not required to be formed in the second region 104 on the side of the third region 106. However, the organic layer 120 may be formed in the second region 104 and the third region 106 on the second region 104 side.

In the present modification example also, the same as Modification Example 1, a possibility of light leakage to a rear surface side of the light-emitting device 10 can be reduced. Meanwhile, in the light-emitting device 10 according to the embodiment or Modification Example 2, the organic layer 120 may have the same configuration as that of the present modification example.

MODIFICATION EXAMPLE 4

Figure 6:
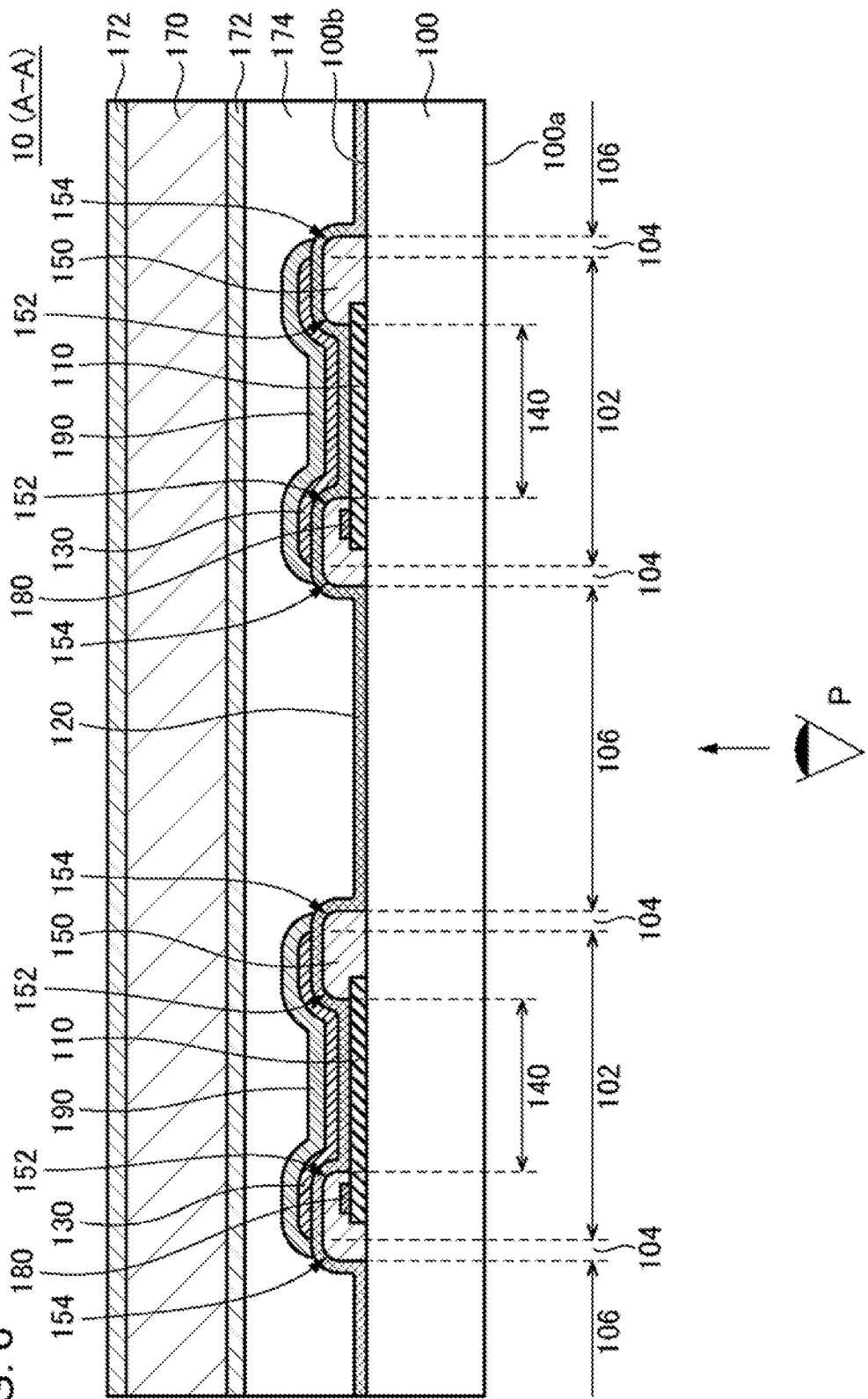
FIG. 6 is a cross-sectional view of a configuration of a light-emitting device according to Modification Example 4.

FIG. 6 is a cross-sectional view of a configuration of a light-emitting device 10 according to Modification Example 4 and corresponds to FIG. 2 of the embodiment. The light-emitting device 10 according to the present modification example has the same configuration as that of the light-emitting device 10 according to the Modification Example 1, except that the first electrode 110 includes a conductive layer 180. The conductive layer 180 is an auxiliary electrode of the first electrode 110, and includes a laminated structure of, for example, a Mo alloy layer, an Al alloy layer, and a Mo alloy layer laminated in this order. The conductive layer 180 may also be formed using an Ag alloy. The conductive layer 180 is formed on a portion of the first electrode 110 covered by the insulating film 150. However, the conductive layer 130 may be formed between the first electrode 110 and the substrate 100 (or between the first electrode 110 and an optical function layer 160).

In the present modification example also, the same as Modification Example 1, a possibility of light leakage to a rear surface side of the light-emitting device 10 can be reduced. Meanwhile, the light-emitting device 10 according to any of the embodiment and Modification Examples 2 to 3 may be provided with the conductive layer 180.

MODIFICATION EXAMPLE 5

Figure 7:
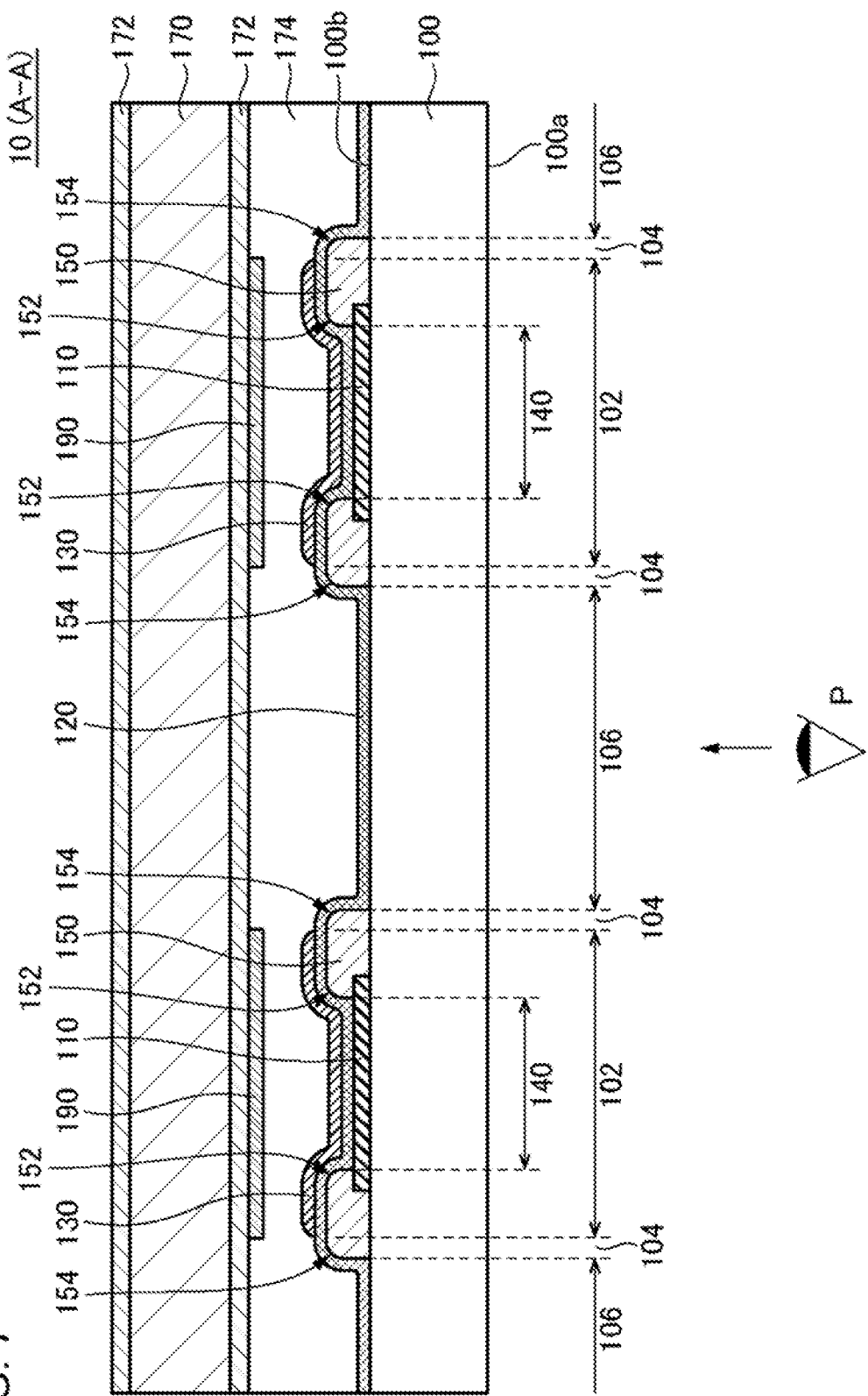
FIG. 7 is a cross-sectional view of a configuration of a light-emitting device according to Modification Example 5.

FIG. 7 is a cross-sectional view of a configuration of a light-emitting device 10 according to Modification Example 5 and corresponds to FIG. 2 of the embodiment. The light-emitting device 10 according to the present modification example has the same configuration as that of the light-emitting device 10 according to the embodiment, except for the location of the low reflection film 190 in the thickness direction of the light-emitting device 10.

In the present modification example, the low reflection film 190 is located between a barrier film 172 of a sealing member 170 on the substrate 100 side and the insulating layer 174. In other words, the low reflection film 190 is formed on a surface of the sealing member 170 on the substrate 100 side (in particular, on the barrier film 172). When viewed in a direction perpendicular to the substrate 100, a region in which the insulating film 150 and the second electrode 130 overlap with the low reflection film 190 is the same as the embodiment. Further, a formation method and a material of the low reflection film 190 are as described in the embodiment.

Figure 8:
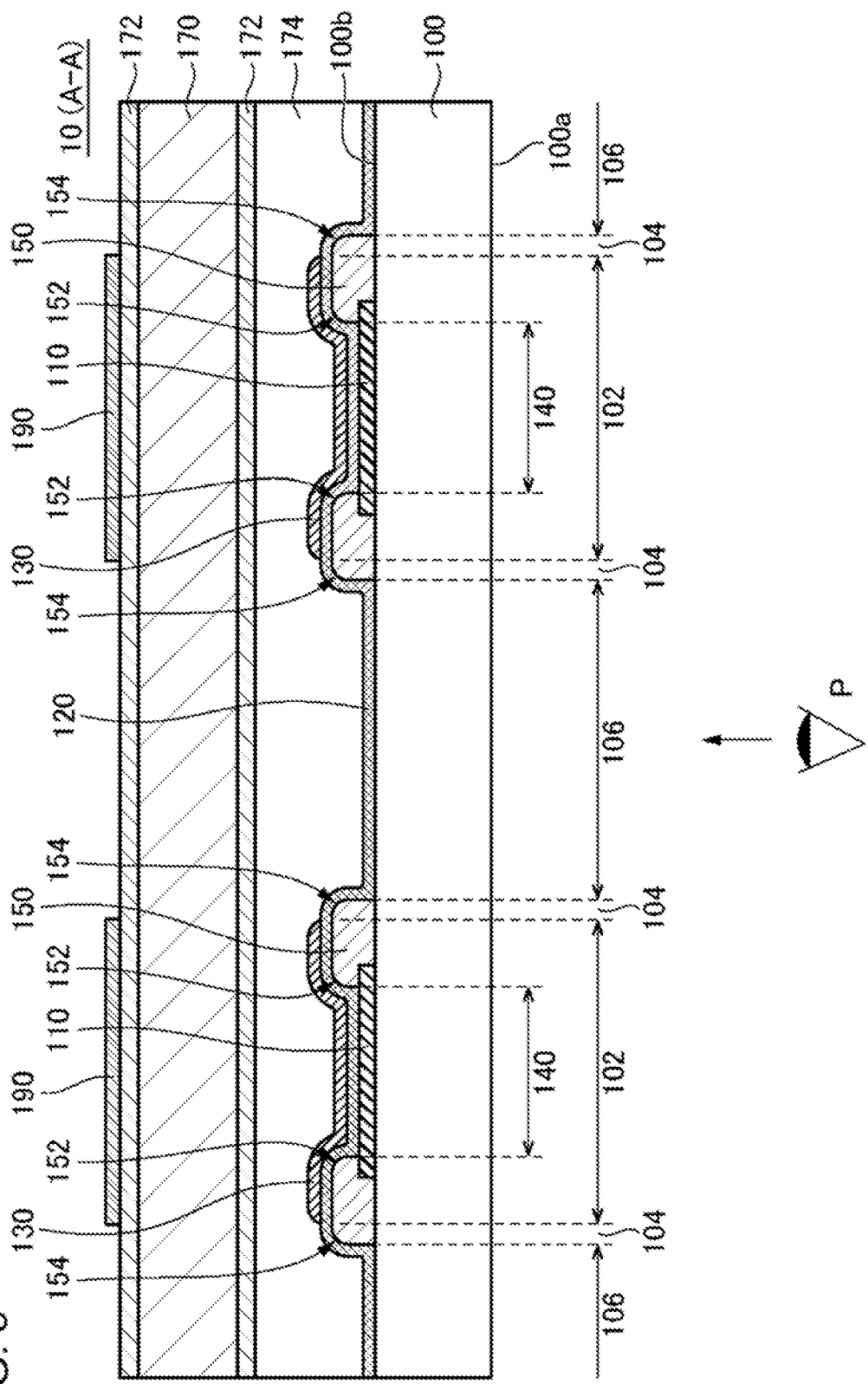
FIG. 8 is a cross-sectional view of a configuration of a light-emitting device according to a modification example of FIG. 7.
Figure 9:
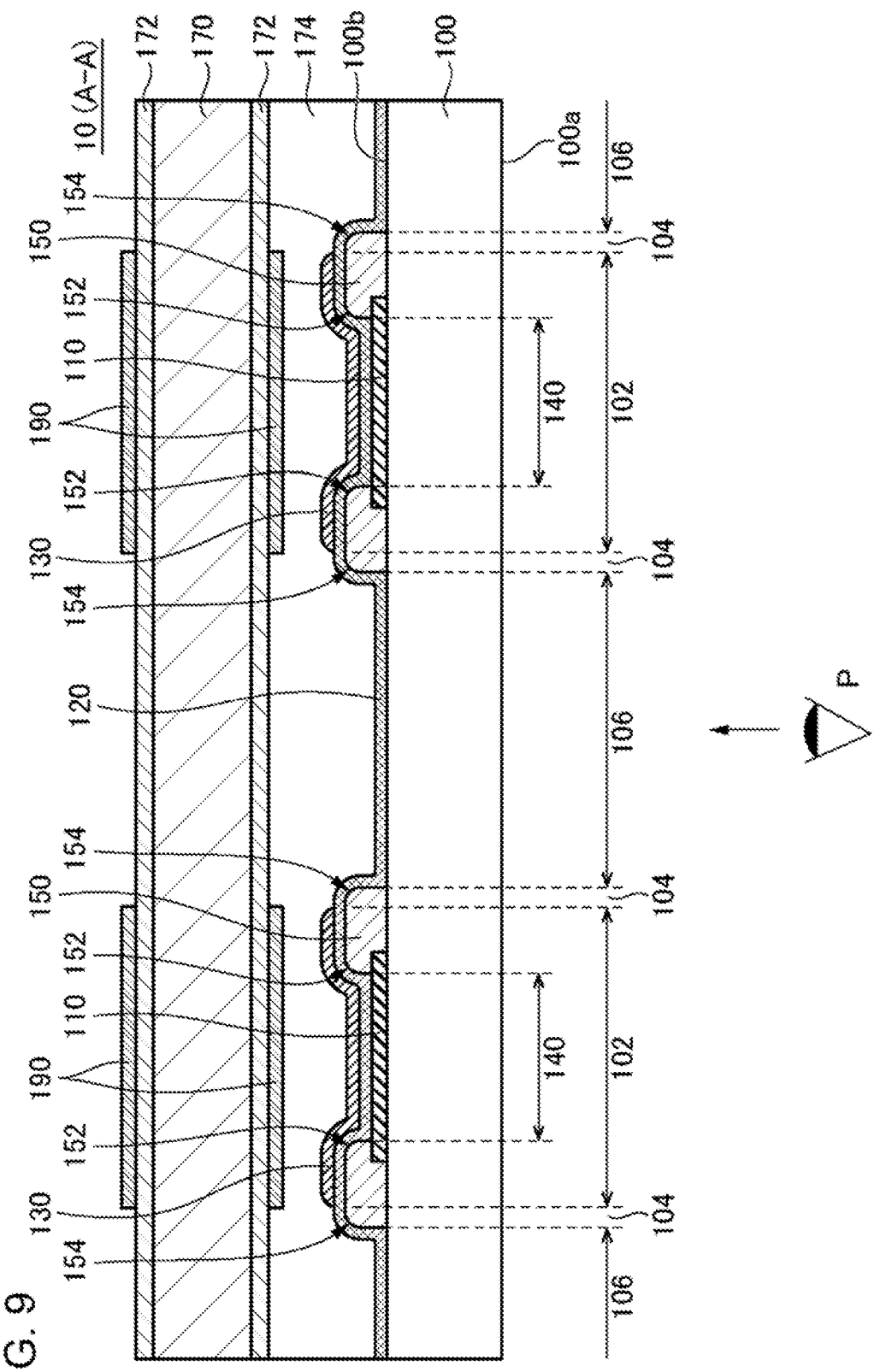
FIG. 9 is a cross-sectional view of a configuration of a light-emitting device according to a modification example of FIG. 7.

Meanwhile, as illustrated in FIG. 8, the low reflection film 190 may be formed on the sealing member 170 on a surface opposite from the substrate 100 (in particular, on the barrier film 172). In addition, as illustrated in FIG. 9, the low reflection film 190 may be formed on the both sides of the sealing member 170.

In the present modification example also, the same as the embodiment, a possibility of light leakage to a rear surface side of the light-emitting device 10 can be reduced. Meanwhile, the light-emitting device 10 according to any of Modification Examples 1 to 4, the low reflection film 190 may be disposed in the same location as the present modification example.

EXAMPLE 1

Figure 10:
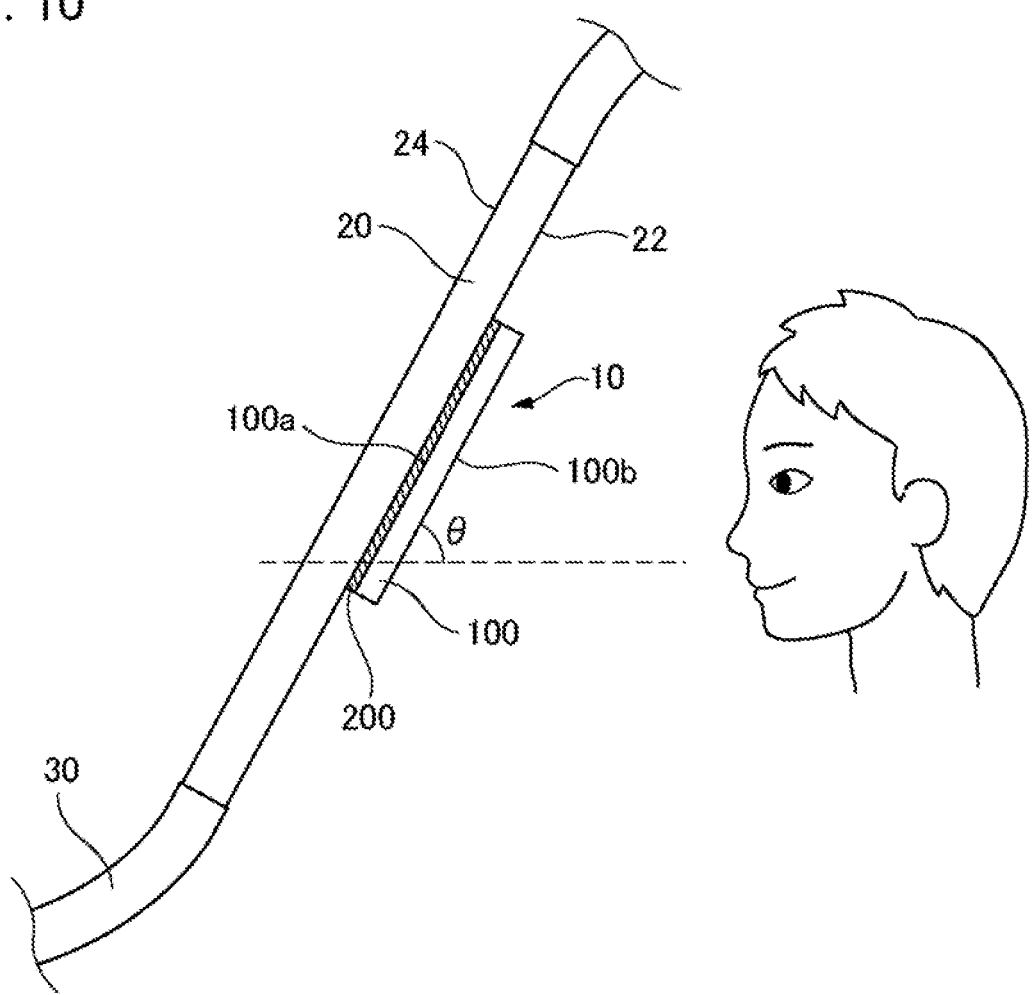
FIG. 10 is a cross-sectional view of a configuration of a light-emitting system according to Example 1.

FIG. 10 is a cross-sectional view of a configuration of a light-emitting system according to Example 1. This light-emitting system includes a light-emitting device 10 and a partition member 20. The partition member 20 includes optical transparency and partitions a space from the exterior thereof. This space is, for example, a space occupied by a person, or a space having an object such as a commercial product disposed therein. The light-emitting device 10 includes the same configuration as that of any of above mentioned embodiments and modification examples. In the example shown in the drawing, a surface of the substrate 100 on the side provided with the light-emitting unit 140 (a second surface 100b) is directed toward the space occupied by a person.

The partition member 20 is, for example, a window of a mobile object 30 for transporting a person, or a window of a showcase, and is formed using glass or a light-transmitting resin. The mobile object 30 is, for example, an automobile, a train, or an airplane. In a case where the mobile object 30 is an automobile, the partition member 20 is a windshield, a rear windshield, or a side window (for example, a door window) installed at the side of a seat. In a case where the partition member 20 is a rear windshield, the plurality of light-emitting units 140 function as, for example, a brake light. In addition, in a case where the partition member 20 is a windshield or a rear windshield, the plurality of light-emitting units 140 may be a turn signal light. In addition, the partition member 20 may be a window for partitioning the interior and the exterior of a room such as a meeting room. The light-emitting system may allow to distinguish whether the meeting room is occupied, depending on the lighting/non-lighting of the light-emitting unit 140. The partition member 20 may be inclined by an angle θ (for example, larger than 45 degrees and smaller than 90 degrees) with respect to a horizontal plane or may be vertical (θ is 90 degrees) with respect to the horizontal plane.

Further, a first surface 100a of the light-emitting device 10, that is, a surface on a light extraction side, is fixed to an inner surface (a first surface 22) of the partition member 20 with an adhesive layer 200 interposed therebetween. Therefore, light emitted from the light-emitting unit 140 of the light-emitting device 10 is emitted to the exterior of the above-mentioned space (for example, the mobile object 30) through the partition member 20. Further, the light-emitting device 10 has optical transparency. Therefore, a person can view the exterior and the interior of the space through the partition member 20. For example, a person inside the mobile object 30 is able to view the exterior of the mobile object 30 through the partition member 20. Meanwhile, the entirety of the first surface 100a of the substrate 100 may be fixed to the first surface 22 of the partition member 20 with the adhesive layer 200 interposed therebetween, or a portion (for example, two sides facing each other) of the first surface 100a may be fixed to the first surface 22 of the partition member 20.

The adhesive layer 200 fixes the light-emitting device 10 to the partition member 20. As long as a material fulfilling such a function is used, there is no particular limitation to the material. In addition, in a case where a refractive index of the partition member 20 and that of the substrate 100 of the light-emitting device 10 are substantially the same, such as, for example, a case where both the partition member 20 and the substrate 100 are formed of glass, a material having the refractive index the same as or close to those of the both is used as the adhesive layer 200. In addition, in a case where the partition member 20 and the substrate 100 are different from each other in refractive indexes (for example, the partition member 20 is formed of plastic, and the substrate 100 is formed of glass), the refractive index of the adhesive layer 200 is preferably a numerical value between the refractive index of the partition member 20 and the refractive index of the substrate 100. With such a configuration, light emitted from the light-emitting device 10 can be efficiently extracted to the outside through the partition member 20. In addition, the light-emitting device 10 and the partition member 20 are preferably bonded to each other without any gaps therebetween, since if there is a gap, light emitted from the light-emitting device 10 is reflected by the partition member 20, and the reflected light is transmitted to the inside through the second region 104 and the third region 106.

The light-emitting device 10 has a configuration shown in any of the embodiment and each modification example. Therefore, a possibility of light leakage to a rear surface side (the right side in FIG. 10) of the light-emitting device 10 can be reduced.

Example 2

Figure 11:
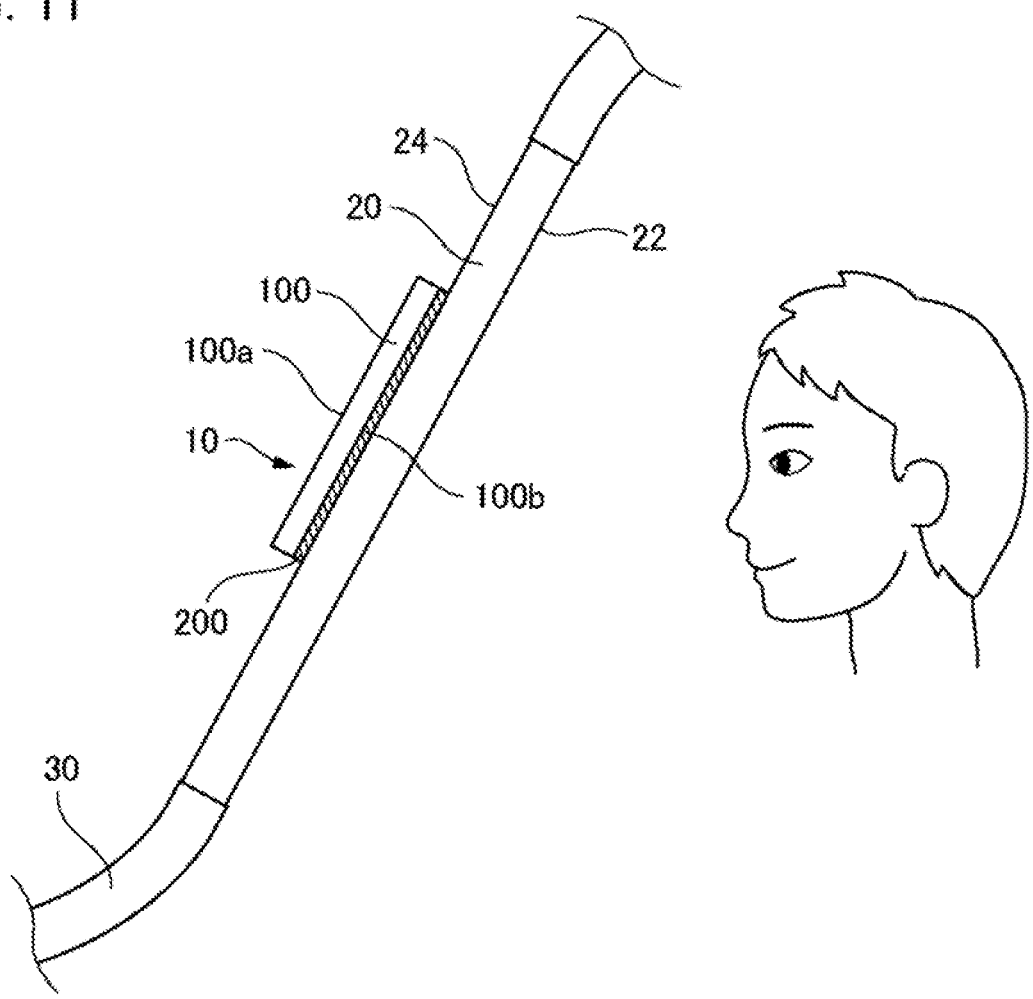
FIG. 11 is a cross-sectional view of a configuration of a light-emitting system according to Example 2.

FIG. 11 is a cross-sectional view of a configuration of a light-emitting system according to Example 2. The light-emitting system according to the present example has the same configuration as that of the light-emitting system according to the Example 1, except that the light-emitting device 10 is mounted on the partition member 20 on an outer surface (a second surface 24) of the mobile object 30.

The light-emitting device 10 according to the present example has a configuration shown in any of the embodiments and each modification example. However, in this light-emitting device 10, the surface thereof on the opposite side of the partition member 20 serves as the light extraction surface. In order to achieve such configuration, the second surface 100b of the light-emitting device 10 may be made to face the partition member 20.

In the present example also, the same as Example 1, a possibility of light leakage to a rear surface side of the light-emitting device 10 can be reduced.

In addition, the light emitted from the light-emitting device 10 is emitted directly to the exterior of the mobile object 30 without passing through the partition member 20. Therefore, compared to the embodiment, a person who is outside the mobile object 30 can easily recognize the light from the light-emitting device 10. In addition, since the light-emitting device 10 is installed on the exterior of the mobile object 30, that is, on the partition member 20 on the second surface 24 side, it is possible to prevent the light from the light-emitting device 10 from being reflected by the partition member 20 and entering the interior of the mobile object 30.

EXAMPLE 3

Figure 12:
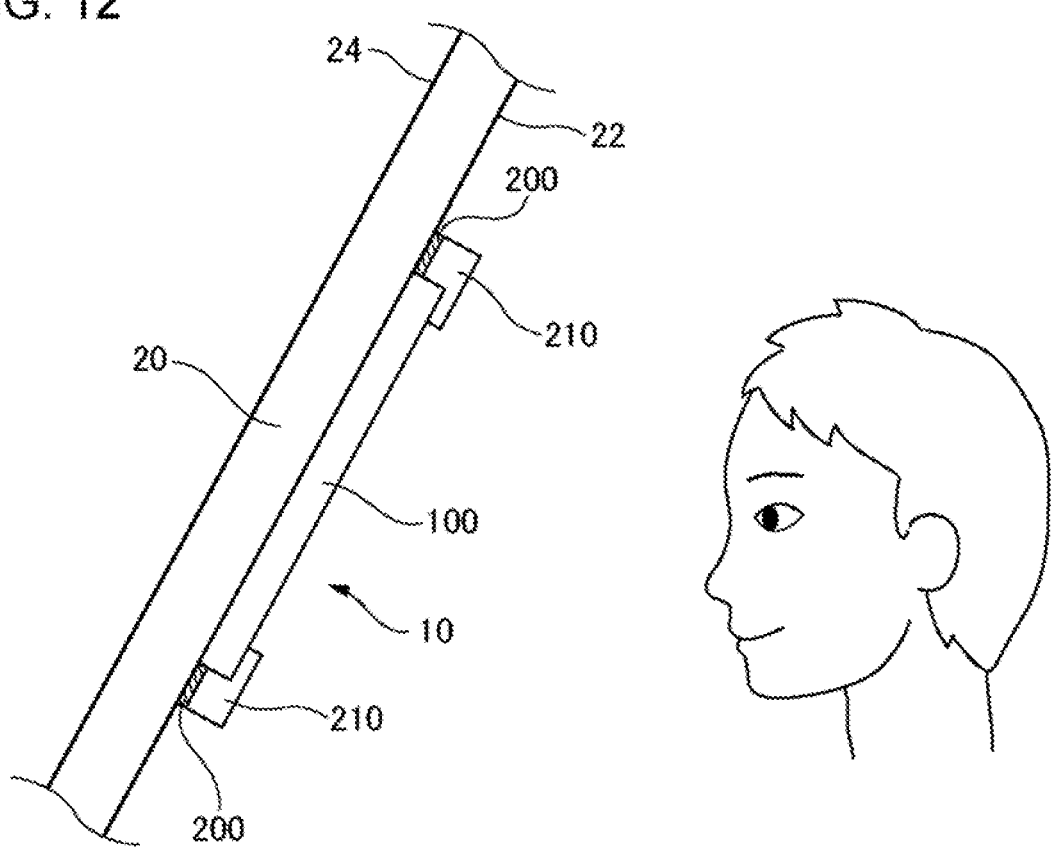
FIG. 12 is a cross-sectional view of a configuration of a light-emitting system according to Example 3.

FIG. 12 is a cross-sectional view of a configuration of a light-emitting system according to Example 3. The light-emitting system according to the present example has the same configuration as that of the light-emitting system according to Example 1, except that the light-emitting device 10 is fixed to the partition member 20 using fixing members 210.

The fixing member 210 is a frame-like member with a lower surface thereof fixed to the partition member 20 using an adhesive layer 200. An upper portion of the fixing member 210 is bent to the inside of the fixing member 210, and this bent portion holds an edge of the light-emitting device 10. However, the shape of the fixing member 210 is not limited to the example shown in the drawing.

In the present example also, the same as Example 1, a possibility of light leakage to a rear surface side of the light-emitting device 10 can be reduced.

Figure 13:
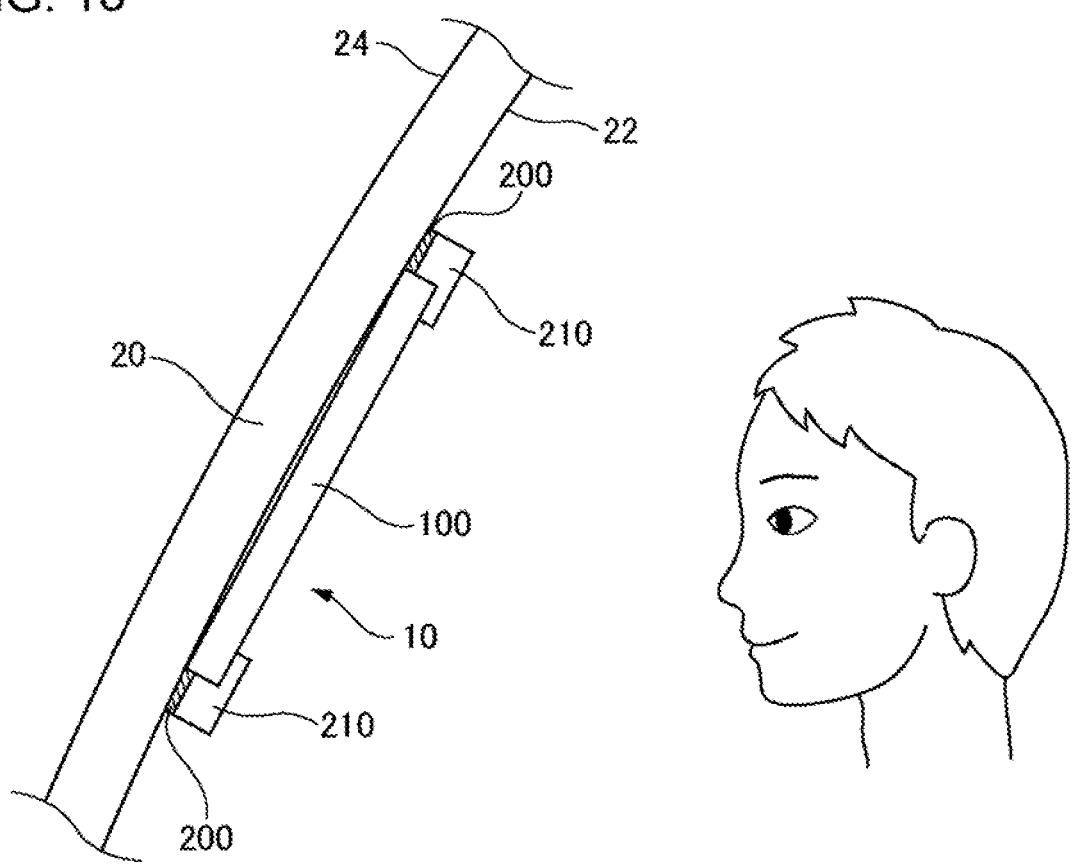
FIG. 13 is a cross-sectional view of a configuration of a light-emitting system according to Modification Example of FIG. 12.

In addition, as shown In FIG. 13, there is a case where the partitioning member 20 may be curved in a direction projecting to the outside of the mobile object 30. In such a case, it is difficult to fix the flat plate-shaped light-emitting device 10 directly to an inner surface (a first surface 22) of the partition member 20. However, use of the fixing member 210 allows the light-emitting device 10 to be fixed to the first surface 22 of the partition member 20 even in such circumstances.

In a case where the curved partition member 20 and the flat plate-shaped light-emitting device 10 are fixed to each other in the above manner, a filler may be filled into a gap between the partition member 20 and the light-emitting device 10. As described above, if there is a gap present therebetween, light emitted from the light-emitting device 10 is reflected by the partition member 20, and the reflected light is transmitted to the interior through a third region 106 of the light-emitting device 10. When the refractive index of the partition member 20 and the refractive index of a substrate 100 of the light-emitting device 10 are substantially the same as each other (for example, when both are formed of glass), the refractive index of a filling member is preferably a value which is the same as or close to these refractive indexes. In addition, when the partition member 20 and the substrate 100 are different from each other in refractive indexes (for example, the partition member 20 is formed of plastic while the substrate 100 is formed of glass), the refractive index of the filler is preferably a numerical value between the refractive index of the partition member 20 and the refractive index of the substrate 100 of the light-emitting device 10.

EXAMPLE 4

Figure 14:
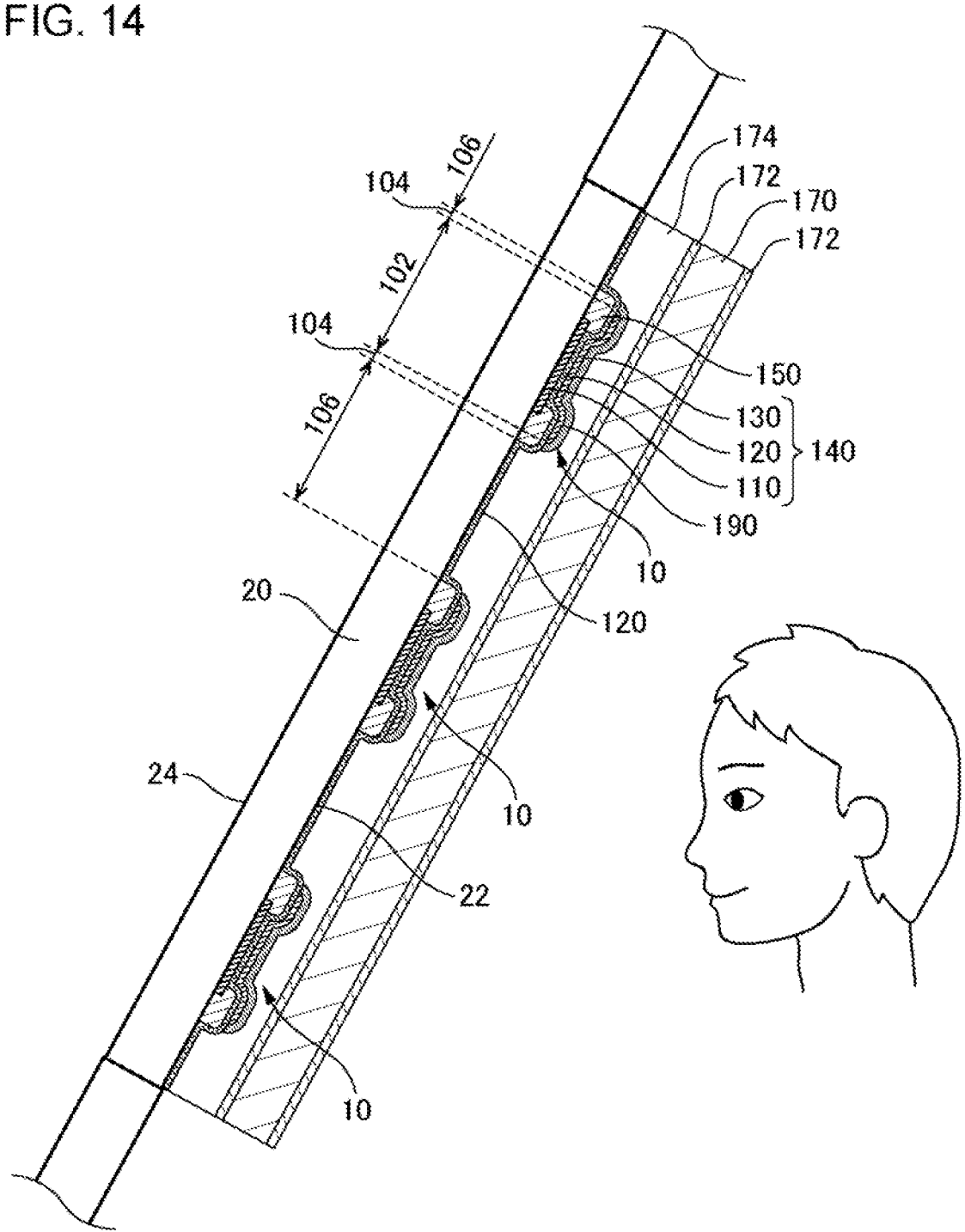
FIG. 14 is a cross-sectional view of a configuration of a light-emitting system according to Example 4.

FIG. 14 is a cross-sectional view of a configuration of a light-emitting system according to Example 4. The light-emitting system according to the present example has the same configuration as that of the light-emitting system according to Example 1, except that the light-emitting unit 140 is formed on the first surface 22 or the second surface 24 of the partition member 20. In other words, in the present example, the partition member 20 also serves as the substrate 100 in Example 1.

Meanwhile, in the present example, a concave portion is formed on a surface of the partition member 20 on which the light-emitting unit 140 is formed, and the light-emitting unit 140 may be formed in this concave portion. For example, one concave portion may be formed in a region in which the plurality of light-emitting units 140 are formed, and the plurality of light-emitting units 140 may be formed on a bottom surface of the concave portion. Alternatively, a concave portion may be individually formed for each of the plurality of light-emitting units 140. In this case, sealing of the light-emitting units 140 may be configured to seal the plurality of concave portions at a time using, for example, film sealing or the like with high optical transparency. The light-emitting units 140 may be prevented from protruding from the partition member 20 in either case of an individual concave portion being formed for each light emitting unit 140 or one concave portion being formed for the plural light emitting units 140. Meanwhile, in a case where the light-emitting unit(s) 140 are formed in the concave portion(s) of the partition member 20, upper parts of the light-emitting units 140 may be projected from the first surface 22 (or the second surface 24) of the partition member 20, or the light-emitting units 140 may be located entirely below the first surface 22 (or the second surface 24).

In the present example also, the same as Example 1, a possibility of light leakage to a rear surface side of the light-emitting device 10 can be reduced.

EXAMPLE 5

Figure 15:
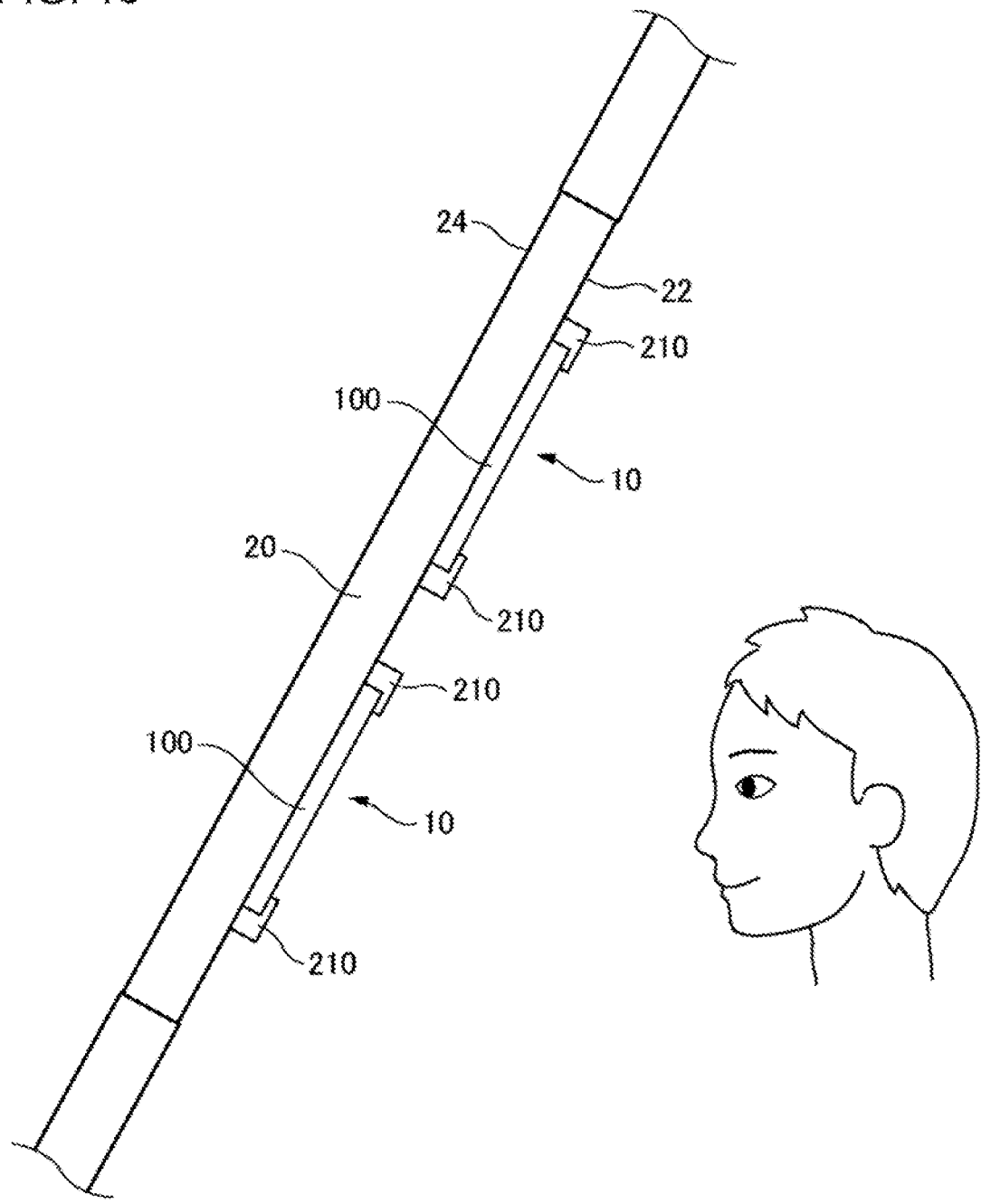
FIG. 15 is a cross-sectional view of a configuration of a light-emitting system according to Example 5.

FIG. 15 is a cross-sectional view of a configuration of a light-emitting system according to Example 5. The light-emitting system according to the present example has the same configuration as that of any of the embodiments, each modification example, and Examples 1 to 4 described above, except that a plurality of the light-emitting devices 10 are installed on the partition member 20. Turning on and off of the lights of the plurality of light-emitting devices 10 may be controlled in accordance with control signals that are the same or different from each other.

In the present example also, the same as Example 1, a possibility of light leakage to a rear surface side of the light-emitting device 10 can be reduced.

EXAMPLE 6

Figure 16:
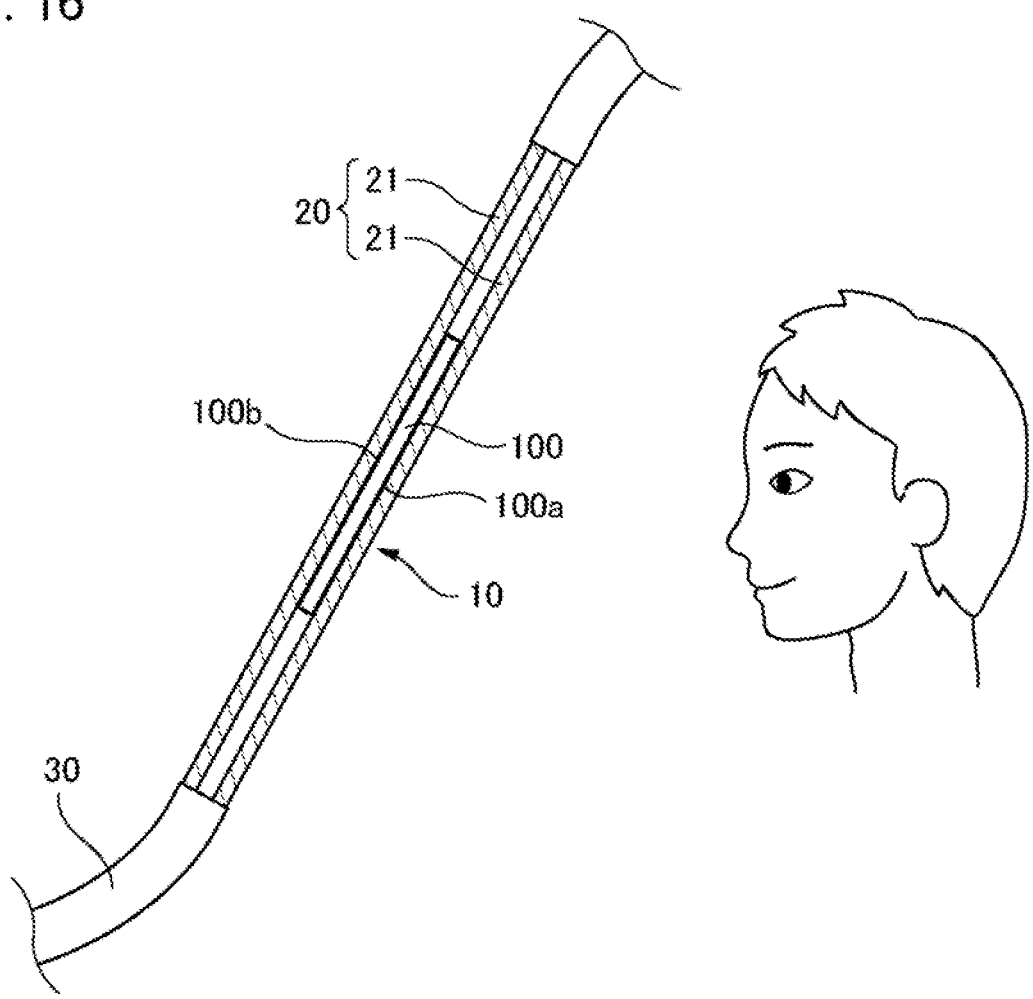
FIG. 16 is a cross-sectional view of a configuration of a light-emitting system according to Example 6.

FIG. 16 is a cross-sectional view of a configuration of a light-emitting system according to Example 6. The light-emitting system according to the present example has the same configuration as that of the light-emitting system according to Example 1, except for the configuration of the partition member 20 and the position of the light-emitting device 10.

In the present example, the partition member 20 has the configuration in which a plurality of light-transmitting members 21 (for example, glass plates or resin plates) overlap each other. Further, the light-emitting device 10 is installed in the partition member 20 by being interposed between the light-transmitting members 21 next to each other.

In the present example also, the same as Example 1, a possibility of light leakage to a rear surface side of the light-emitting device 10 can be reduced.

As described above, although the embodiments and examples of the present invention have been set forth with reference to the accompanying drawings, they are merely illustrative of the present invention, and various configurations other than those stated above can be adopted.

The invention claimed is:

1. A light-emitting device comprising:
   a light-transmitting substrate;
   a plurality of light-emitting units formed on the substrate, each light-emitting unit comprising a light-transmitting first electrode, a light-reflective second electrode, and an organic layer located between the first electrode and the second electrode;
   a light-transmitting region located between the second electrodes of the plurality of light-emitting units;
   a sealing member that covers the light-emitting unit; and
   a low reflection film located on an opposite side of the substrate with the second electrode there between,
   wherein the second electrode comprises an inclined portions, and
   wherein the low reflection film overlaps the at least the inclined portion, and is located on a surface of the second electrode on the sealing member side.

2. The light-emitting device according to claim 1, wherein the sealing member is fixed to the light-emitting unit directly or through an adhesive layer.

3. The light-emitting device according to claim 1, wherein the plurality of light-emitting units extend in a same direction as each other when viewed from a direction perpendicular to the substrate.

4. The light-emitting device according to claim 1, further comprising an insulating film that defines the light-emitting unit and comprises a taper,
   wherein the second electrode covers at least one portion of the taper,
   wherein the insulating film comprises a first taper that faces the light-emitting unit, and
   wherein the low reflection film covers the first taper.

5. The light-emitting device according to claim 4,
   wherein the insulating film comprises a second taper that faces the light-transmitting region, and
   wherein the low reflection film covers the first taper and the second taper.

6. The light-emitting device according to claim 1,
   wherein the low reflection film comprises a material having a reflectance lower than that of the second electrode.

7. The light-emitting device according to claim 6,
   wherein the low reflection film comprises a material containing Cr, Ni, Mo, carbon black, or titanium black.

8. A light-emitting system comprising:
   a partition member that partitions a space from an exterior;
   a light-transmitting substrate disposed on the partition member;

a plurality of light-emitting units formed on the substrate, each light-emitting unit comprising a light-transmitting first electrode, a light-reflective second electrode, and an organic layer located between the first electrode and the second electrode;

a light-transmitting region located between the second electrodes of the plurality of light-emitting units;

a sealing member that covers the light-emitting unit, and a low reflection film located on an opposite side of the substrate with the second electrode there between, wherein the second electrode comprises an inclined portion, and wherein the low reflection film overlaps the at least the inclined portion, and is located on a surface of the second electrode on the sealing member side.

9. The light-emitting system according to claim 8,
wherein the sealing member is fixed to the light-emitting unit directly or through an adhesive layer.

10. The light-emitting system according to claim 8,
wherein the plurality of light-emitting units extend in a same direction as each other when viewed from a direction perpendicular to the substrate.

11. The light-emitting system according to claim 8, further comprising an insulating film that defines the light-emitting unit and comprises a taper, wherein the second electrode covers at least one portion of the taper, wherein the insulating film comprises a first taper that faces the light-emitting unit, and wherein the low reflection film covers the first taper.

12. The light-emitting system according to claim 11,
wherein the insulating film comprises a second taper that faces the light-transmitting region, and wherein the low reflection film covers the first taper and the second taper.

13. The light-emitting system according to claim 8,
wherein the low reflection film comprises a material having a reflectance lower than that of the second electrode.

14. The light-emitting system according to claim 13,
wherein the low reflection film comprises a material containing Cr, Ni, Mo, carbon black, or titanium black.

* * * * *